United States Patent [19]

Seidel

[11] 4,386,242

[45] May 31, 1983

[54] IMPEDANCE MATCHING USING ACTIVE COUPLERS

[75] Inventor: Harold Seidel, Warren, N.J.

[73] Assignee: Bell Telephone Laboratories, Incorporated, Murray Hill, N.J.

[21] Appl. No.: 239,340

[22] Filed: Mar. 2, 1981

[51] Int. Cl.³ .......................... H03F 3/62; H04M 1/76
[52] U.S. Cl. .............................. 179/170 T; 179/170.2
[58] Field of Search ............. 333/17 M, 32, 109, 124; 179/170.2, 170.6, 170.8, 170 T

[56] References Cited

U.S. PATENT DOCUMENTS 3,132,313  5/1964  Alford .................................. 333/32
3,612,780  10/1971  Beurrier et al. .................. 179/170 T
3,967,220  6/1976  Tagashira et al. .................. 333/109

Primary Examiner—G. Z. Rubinson
Assistant Examiner—Randall P. Myers

Attorney, Agent, or Firm—J. T. Peoples

[57] ABSTRACT

Circuitry (100) for providing impedance compensation between a source impedance (501) and a load impedance (505) which is proportional to the source impedance comprises: a pair of directional couplers (200 and 300), each coupler including bidirectional transmitting and receiving paths and a unidirectional path coupling these paths; means (121) for cascading the transmit path of one coupler to the receive path of the other; and unidirectional amplifier (400) for interconnecting the remaining bidirectional transmission ports. The impedance match to the source is obtained by adjusting the amplifier gain in correspondence to the number of essentially identical terminations that are bridged to form the load impedance. Means (510–515) sense the number of active terminations and transmit this information to the amplifier so the appropriate gain setting may be established.

4 Claims, 4 Drawing Figures

IMPEDANCE MATCHING USING ACTIVE COUPLERS

BACKGROUND OF THE INVENTION

1. Field of the Invention

This invention relates generally to echo cancellation circuitry and, more particularly, to impedance compensation circuitry utilizing active, directional couplers.

2. Description of the Prior Art

With the impending availability of digital subscriber telephone loops, the potential exists for virtually echo-free transmission over the loops. The main source of echo-generating reflections will then be found on the analog portion of a completed connection, that is, on customer premises, and will occur primarily because of numerous terminations being simultaneously operative. For example, business customers oftentimes utilize a conference call arrangement wherein two or more transmission paths are bridged or paralleled with minimal compensation for the impedance mismatch caused by bridging. Such mismatches are wideband as well as frequency sensitive and may cause particularly deleterious effects on the overall quality of an all digital plant. Also, residential customers often communicate in a mode wherein two telephones are simultaneously off-hook at one location and the only compensation is provided by termination dependent DC current flowing to the telephone instruments.

Echo or reflection characteristics of a network or a loop transmission facility may be expressed in terms of a quantity called return loss, which is a measure of the impedance mismatch at any point in the network or facility and is proportional to the energy reflected at the irregularity whenever an incident wave impinges on the irregularity. Return loss, in decibels, is expressed by $20 \log |(Z+Z_T)/(Z-Z_T)|$, where $Z$ is the impedance at the point under consideration and $Z_T$ is a reference impedance. A high return loss indicates $Z$ is closely matched to $Z_T$ and reflections due to this mismatch are minimal; return losses of 20 dB or more are typical of well-matched loops or terminations.

As an example of these return loss principles applied to the specific case of bridged telephone extensions, it is supposed that the reference impedance $Z_T$ equals the characteristic impedance $Z_o$ of the transmission facility. If each telephone path has an off-hook impedance $Z_o$ then, to first order, the bridged impedance is $Z_o/2$ and a substantial mismatch occurs; the return loss is only about 10 dB.

An echo canceler compensates for the impedance mismatch, typically by sensing the source signal and reinjecting a portion of the source signal into the path traversed by the echo or mismatch signal. When the reinjected signal is the negative of the signal returned from the source of reflection, the effect of the reflection is canceled and the signal source operates into a fully matched network.

Prior art echo cancelers are exemplified by those types of cancelers utilized on long-haul analog facilities. In such systems, bidirectional signals carried over two-wire subscriber loops are split into separate transmit and receive unidirectional signals for long distance transmission. Hybrid circuits are standard and well-known arrangements for achieving this separation, and perfect separation is possible when the hybrid balancing network equals the impedance of the two-wire line. However, since subscriber loops present a wide range of impedances, mismatches, and consequently echoes, do occur.

A reference representative of the prior art two-to-four wire echo cancelers is U.S. Pat. No. 3,500,000 issued Mar. 10, 1970 to Kelly and Logan. The patent discloses an adaptive echo canceler, implemented with transversal filters, operating on analog facilities. In this echo canceler, a portion of the analog signal incoming to the hybrid junction on the four-wire side is passed through a transversal filter with adjustable tap gain controls to synthesize a cancellation signal for subtraction from the signal outgoing on the other four-wire path. The resultant outgoing signal is clipped and correlated with the sequence of samples of the incoming signal appearing at the taps of the transversal filter to form control signals for the tap gains of the filter. Because of the variability of subscriber loop impedances, the echo circuitry can become extremely complex and the number of taps required is prohibitively large. Moreover, the circuitry as disclosed only operates in a two-to-four wire environment.

SUMMARY OF THE INVENTION

These and other limitations and shortcomings of the prior art are precluded, in accordance with the present invention, with an echo canceler network which operates in a two-wire analog environment by utilizing the decoupling property of directional couplers.

In the preferred embodiment of the present invention, the echo canceler network is realized with two four-port directional couplers connected in cascade. Each coupler has equal symmetric mode and antisymmetric mode gains. Two of the ports from each coupler serve as input and output bidirectional ports, respectively, whereas the two remaining ports serve as input and output unidirectional ports. A signal at the unidirectional input port is transmitted to the unidirectional output port only, and vice versa. However, a signal applied to the bidirectional input (output) port is transmitted both to unidirectional the input (output) port and the bidirectional output (input) port. A transfer signal circuit is directively coupled from the unidirectional input port of the second coupler in the cascade to the bidirectional input port of the first coupler. The input to the canceler is provided by the unidirectional input port of the first coupler whereas the canceler's output coincides with the bidirectional output port of the second coupler. The canceler arrangement is completed by connecting the unidirectional output port of the first coupler to the bidirectional input port of the second coupler and by terminating the one remaining port from each coupler with an impedance. When (i) the source impedance of the network driving the canceler, the reference impedance of each coupler and the coupler terminating impedances are all equal and (ii) the load impedance is proportional to the source impedance, then a transfer network comprised of an amplifier having a gain factor determined by a bilinear transformation on the load proportionality factor completely compensates for the mismatched load.

One feature of the invention is that only a feedforward design is utilized, thereby effecting an inherently stable system. Also, because there are no feedback loops, the frequency range is extremely broadband. In addition, total cancellation is effected by the adjustment of only one variable—the amplifier gain.

These and other features and advantages will be better understood from a detailed description of an illustrative embodiment thereof, which follows, when taken in conjunction with the accompanying drawing.

DETAILED DESCRIPTION

Figure 1:
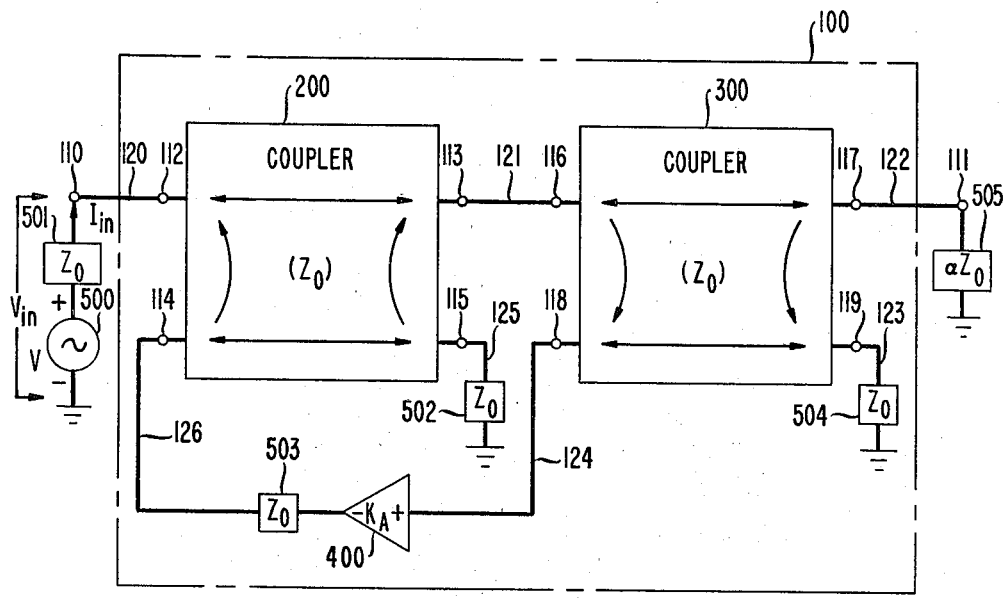
FIG. 1 is a diagram, partly in schematic form and partially in block form, depicting one embodiment of the echo canceler in accordance with the present invention.

In FIG. 1 there is shown an illustrative embodiment of echo canceler circuitry 100 which compensates for the impedance mismatch between source impedance 501 ($Z_o$) and load impedance 505 ($\alpha Z_o$, where $0 < \alpha \leq 1$). In particular, circuitry 100 comprises: (1) a pair of active, directional couplers 200 and 300 having characteristic or reference impedance $Z_o$; and (2) inserting amplifier 400, having KA and output impedance 503 ($Z_o$), directively coupled from unidirectional input terminal 118 of coupler 300 to bidirectional input terminal 114 of coupler 200. In addition, unidirectional input terminal 112 of coupler 200 serves as the input to circuitry 100, via node 110, whereas bidirectional output terminal 117 of coupler 300 serves as the output of circuitry 100, via node 111. Moreover, unidirectional output terminal 113 of coupler 200 connects to bidirectional input terminal 116 of coupler 300. Finally, reference impedances 502 and 504 (each of value $Z_o$) terminate bidirectional and unidirectional output terminals 115 and 119 of couplers 200 and 300, respectively.

The series electrical path from source 500 to load 505 comprising: impedance 501; lead 120 connecting node 110 to terminal 112; the internal unidirectional path of coupler 200; lead 121 between terminals 113 and 116; the internal bidirectional path of coupler 300; and lead 122 connecting terminal 117 with node 111, is the bidirectional path for transmission to and reflection from load 505. The series electrical path comprising: the unidirectional path of coupler 200; lead 121; left cross-coupling path of coupler 300 (which internally transmits signals from terminal 116 to terminal 118); the series arrangement of amplifier 400 and impedance 503 delivered through leads 124 and 126; and left cross-coupling path of coupler 200 (which internally transmits signals from terminal 114 to terminal 112) serves as the echo cancellation or signal compensation path. The signal sensed at terminal 116 is returned via the canceler path and reinjected at terminal 112. When this reinjected signal is the negative of the signal generated at the load due to a mismatch, the effect of the mismatch may be canceled and source 500 operates into a matched load.

Figure 2:
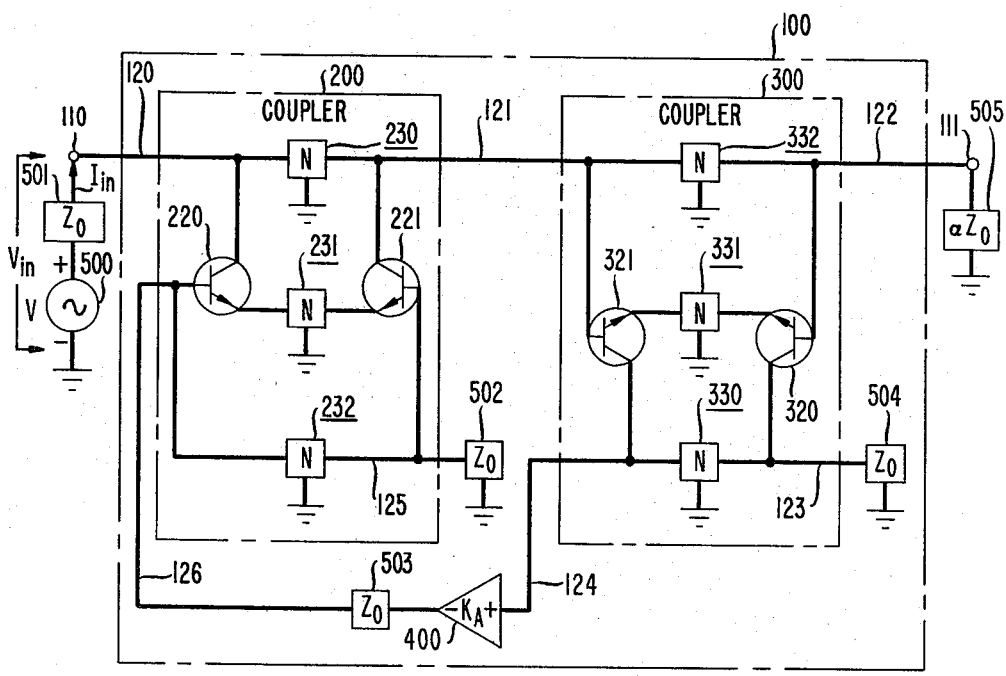
FIG. 2 shows a transistorized network as one type of network utilized as couplers 200 and 300 in FIG. 1.

In FIG. 2, a representative embodiment of circuitry 100 is shown wherein coupler 200 and 300 are each realized with transistorized networks of the type disclosed in my U.S. Pat. No. 3,612,780, issued Oct. 12, 1971. Although elements 220, 221, 320 and 321 are depicted as transistors, it will be recognized, however, that other types of active elements may readily be used. The six identical networks 230–232 and 330–332, labeled N, are networks subject to certain constraints to be given shortly; for purposes of illustrating the present invention, T-networks are utilized ($Z_1$ and $Z_2$ of FIG. 3) as representative of one type of N network. Finally, direct current biasing sources and connections have been omitted so as not to unduly complicate the circuit diagram and description.

The objective of the following analysis is to demonstrate that the ratio of the voltage $V_{in}$ appearing at node 110 in FIG. 2 to the current $I_{in}$ flowing into node 110 due to voltage source 500 yields as input impedance $Z_{in} = V_{in}/I_{in}$ such that $Z_{in} = Z_o$ for $$K_A = \left(\frac{1-P^2}{2P}\right)\left[\frac{1+\alpha\left(\frac{P^2+1}{2P}\right)}{1+\alpha}\right], \tag{1}$$

where P is an arbitrary parameter subject to $0 < P < 1$. With $Z_{in} = Z_o$ and the impedance of network 501 equal to $Z_o$, an impedance match at node 110 is achieved.

Figure 3:
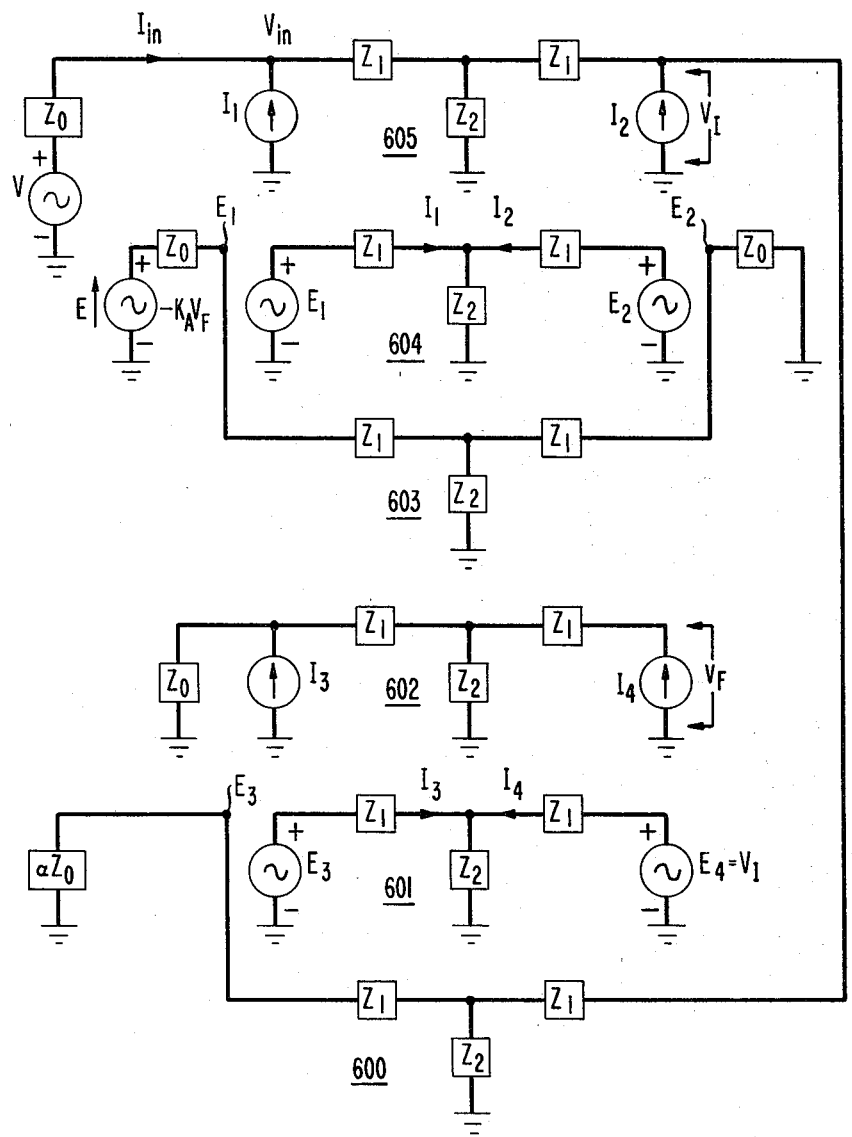
FIG. 3, included for the purpose of analysis, depicts an equivalent circuit of the network shown in FIG. 2 and wherein T-networks have been utilized as one type of N-network shown in FIG. 2.

If it is assumed for the purposes of this analysis that transistors 220, 221, 320 and 321 have extremely large base impedance relative to the input impedance of networks 232 and 332, and the emitter and collector currents of each transistor are equal, then a model representative of FIG. 2 is depicted in FIG. 3.

Networks 230–232 and 330–332 have the same transfer characteristics and are matched with respect to an arbitrary impedance level designated initially as $Z_R$. Being matched two-ports, they can be characterized by a bisected symmetric impedance $Z_S = Z_1 + 2Z_2$ and a bisected antisymmetric impedance $Z_A = Z_1$, where $$Z_S/Z_R = Z_R/Z_A \tag{2}$$

or $$Z_S Z_A = (Z_1 + 2Z_2)Z_1 = Z_R^2. \tag{3}$$

Thus, any two-port network satisfying equation (2) and having input-to-output coupling may be employed as networks 230–232 and 330–332. The particular T-networks shown in FIG. 3, each having series arm $Z_1$ and shunt arm $Z_2$, satisfy the requisite level of generality to demonstrate the principles of this invention.

With suitable circuit analysis techniques, it is easily demonstrated, for circuit 600 of FIG. 3, that:

$$E_3 = [(\alpha Z_o Z_2)/\Delta_L]V_I, \tag{4}$$

where $$\Delta_L = Z_R^2 + \alpha Z_o(Z_1 + Z_2) \tag{5}$$

and $V_I$ is output signal from network 605.

Analysis of circuit 601, using the above results, yields:

$$I_3 = G_1 V_I \text{ and } I_4 = G_2 V_I, \tag{6}$$

where $$G_1 = -Z_2/\Delta_L \tag{7}$$

and $$G_2 = (\alpha Z_o + Z_1 + Z_2)/\Delta_L \quad (8)$$

Analysis of circuit 602 to determine the value of the voltage $V_F$ generated across current source $I_4$ results in:

$$V_F = G_3 V_I, \quad (9)$$

where $$G_3 = Z_R G_2 + Z_R Z_2 G_1/(Z_1 + Z_2 + Z_R). \quad (10)$$

Equation (9) describes the response of coupler 300, as detected on lead 124 of FIG. 2, presuming a signal $V_I$ on lead 121 drives coupler 300. Since amplifier 400 interconnects couplers 200 and 300, the results of the analysis to this point must be embedded into a similar analysis of coupler 200 to yield the overall response of canceler network 100. To this end, analysis of circuit 603 of FIG. 3 yields:

$$E_1 = -K_A V_F/2 \quad (11)$$

and $$E_2 = (-K_A Z_2 V_F)/[2(Z_R + Z_1 + Z_2)], \quad (12)$$

where $K_A$ is an amplifier gain factor, presently unknown. The result of the overall analysis of circuit 100, to be completed shortly, will yield the appropriate value for $K_A$ so that $Z_{in} = Z_o$.

Analysis of circuit 604 leads to:

$$I_1 = (-K_A V_F)/(2Z_R) \quad (13)$$

and $$I_2 = (K_A Z_2 V_F)/[2Z_R(Z_R + Z_1 + Z_2)]. \quad (14)$$

Finally, analysis of circuit 605 yields, for the reference impedance $Z_R$ of the T-networks now set equal to $Z_o$:

$$V_{in} = \quad (15)$$

$$V\left[\left(\frac{2}{Z_1} + \frac{1}{Z_2}\right)\left(\frac{1}{Z_1} - G_4\right) - \frac{1}{Z_1^2}\right]/(Z_o \Delta_V),$$

where $$G_4 = K_A G_3 Z_2/[2Z_o(Z_o + Z_1 + Z_2)]$$

and $$\Delta_V = (Z_o + Z_1 + Z_2)/(Z_o Z_1^2 Z_2).$$

For a matched condition, $V_{in} = V/2$, so that equation (15) may be solved for $K_A$:

$$K_A = \frac{Z_2}{Z_o}\left[\frac{1 + \alpha\left(\frac{Z_1 + Z_2}{Z_o}\right)}{1 + \alpha}\right]. \quad (16)$$

If $Z_1 = PZ_o$, then because of the constraint imposed by equation (2) or (3), $$Z_2 = (1 - P^2/2P)Z_o \text{ and } 0 < P < 1. \quad (17)$$

It then follows that equation (16) reduces to the purely numerical form of equation (1), repeated here for convenience:

$$K_A = \left(\frac{1 - P^2}{2P}\right)\left[\frac{1 + \alpha\left(\frac{P^2 + 1}{2P}\right)}{1 + \alpha}\right], \quad (1)$$

Thus, each time load impedance 505 is modified by either bridging or removing of bridging terminations, an appropriate amplifier gain setting may be simultaneously selected, as determined by equation (1), to cancel the effects of a mismatch as detected at the input (node 110) of circuit 100.

EXAMPLE

As a practical example, it is supposed that $Z_1 = Z_o/3$ ($P = \frac{1}{3}$) so that $Z_2 = 4Z_o/3$; then $$K_A = \frac{4}{3}\left(\frac{1 + \frac{5}{3}\alpha}{1 + \alpha}\right). \quad (18)$$

The following table indicates the required amplifier gain to achieve a matched condition as a function of $\alpha$, that is, as a function of the number of impedance networks of value $Z_o$ that are bridged to form the load $\alpha Z_o$ ($\alpha = 1$ corresponds to a single network; $\alpha = \frac{1}{2}$ corresponds to the bridging or paralleling of 2 networks, and so forth).

| $\alpha$ | $K_A$ | |
|---|---|---|
| 1 | $\frac{16}{9}$ | $\approx 1.77$ |
| $\frac{1}{2}$ | $\frac{44}{27}$ | $\approx 1.63$ |
| $\frac{1}{3}$ | $\frac{14}{9}$ | $\approx 1.55$ |
| $\lim_{\alpha \to o} K_A$ | $\frac{4}{3}$ | $\approx 1.33$ |

In both the foregoing analysis and the example, it was presumed that all six networks 230-232 and 320-332 were identical. As disclosed in my earlier U.S. Pat. No. 3,612,780 issued Oct. 12, 1971, it is possible to generalize the design of coupler 200 or 300 so that nonidentical networks may replace networks 230-232 or 330-332, respectively. For instance, network 230 may have high symmetric and antisymmetric impedances so as to match the collectors of transistors 220 and 221 whereas network 231 may have a low impedance level to match emitter requirements. In the generalized impedance setting, an expression similar to equation (1) may be straightforwardly derived to yield the one-to-one correspondence between the gain of amplifier 400 and the number of bridged terminations represented by element 505.

Since the amplifier gain is dependent upon the termination conditions (represented by the value of $\alpha$), means for sensing the change in terminal conditions and transmitting this information to amplifier 400 must be provided. The technique for accomplishing this depends upon the particular application.

Figure 4:
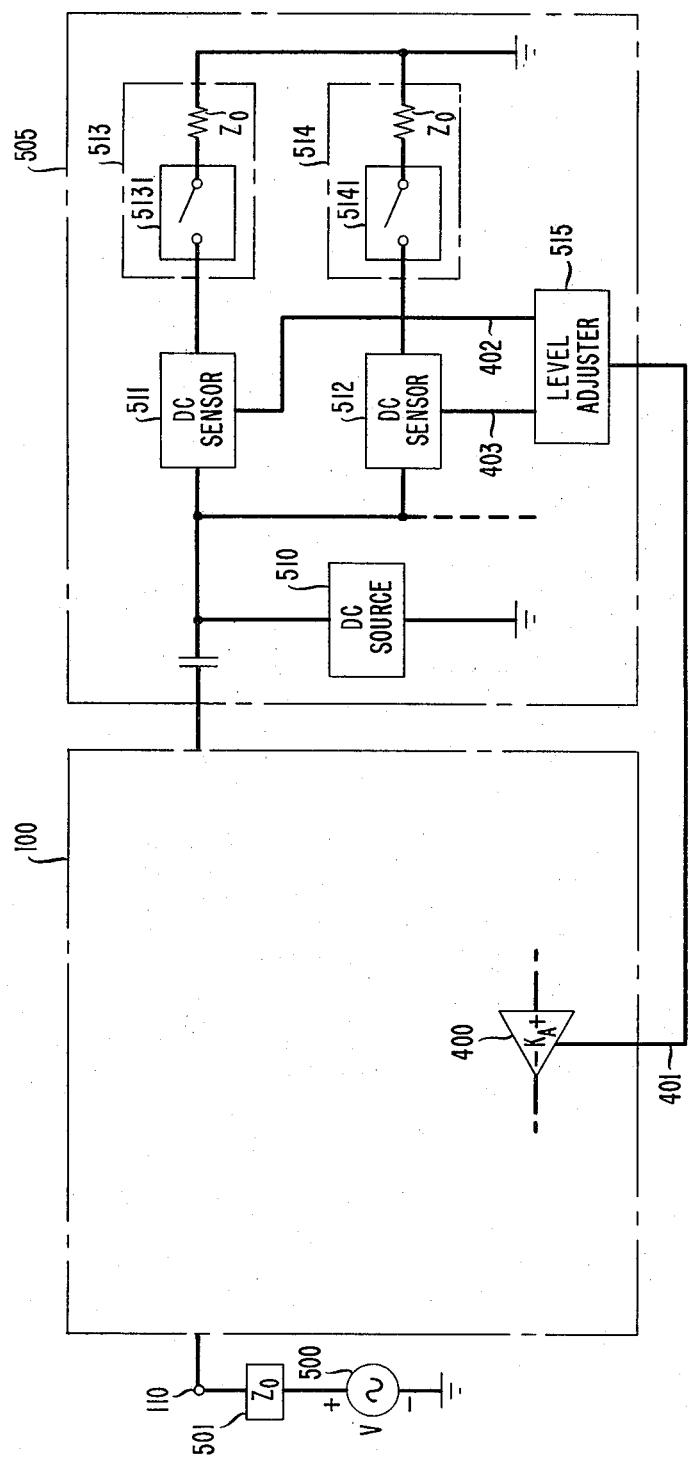
FIG. 4 depicts a type of termination 505, which is DC-dependent, wherein the DC current flow in individual terminations is utilized to adjust the gain of amplifier 400.

The circuitry of FIG. 4 depicts one type of situation wherein terminations 513 and 514, comprising network 505, are DC-dependent. The source of DC is supply 510 which feeds networks 513 and 514 in parallel. DC sensors 511 and 512 are placed in series with networks 513 and 514, respectively. Whenever switch 5131 in network 513 is closed, the DC current supplying load $Z_o$ (which is a network equivalent representation of a complex, DC-dependent impedance, e.g., a telephone set) is sensed by network 511. Similarly, sensor 512 indicates the state of DC current flow to network 514. Both sensors 511 and 512 transmit the current flow conditions to level adjuster 515 via leads 402 and 403, respectively. Adjuster 515 is arranged to provide a signal to amplifier 400, via lead 401, so that the gain may be adjusted according to the number of DC-fed terminations that are active.

It will be further understood that the circuitry for hereindescribed is not limited to specific forms described by way of illustration, but may assume other embodiments limited only by the scope of the appended claims.

What is claimed is:

1. Impedance matching circuitry (100) to compensate for a mismatch between a source impedance and a load impedance proportional to said source impedance, said circuitry comprising two directional couplers (200 and 300), each of said couplers further comprising
   two active members (220,221 or 320,321), each having an emitting element, a control element and a collecting element,
   first, second and third two-part networks 230–232 or 330–332) connected, respectively, between said emitting element, said control element and said collecting element of said members, said networks arranged so that the symmetric mode transfer gain and the antisymmetric mode transfer gain, measured between said control elements and said collecting elements, are equal,
   wherein said source impedance is connected to said collecting element of said first member of said first coupler and said load impedance is connected to said control element of said first member of said second coupler, said circuitry characterized by
   circuit means (400,503) unidirectionally coupling said collecting element of said second member of said second coupler to said control element of said first member of said first coupler, and
   means (121,502,504) for connecting said collecting element of said second member of said first coupler to said control element of said second member of said second coupler, and for terminating both said control element of said second member of said first coupler and said collecting element of said first member of said second coupler with impedances equal to said source impedance.

2. The circuitry as recited in claim 1 wherein said circuit means includes a unidirectional amplifier (400).

3. The circuitry as recited in claim 2 wherein said source impedance has value $Z_o$ and said load impedance has value $\alpha Z_o$, $0 < \alpha \leq 1$,
   each of said networks has a bisected antisymmetric impedance of $PZ_o$ and a bisected symmetric impedance of $(1-P^2) Z_o/2P$, where P is an arbitrary constant such that $0 < P < 1$, and
   said amplifier has gain $$\left(\frac{1-P^2}{2P}\right) \left[\frac{1 + \alpha\left(\frac{P^2 + 1}{2P}\right)}{1 + \alpha}\right]$$

4. Circuitry as recited in claim 3 wherein the gain of said amplifier is adjustable and said circuitry further comprises
   means (510–515) associated with said load (505) for sensing the number of active load terminations, represented by $\alpha$, and for adjusting said amplifier gain in accordance with said number of active terminations.

* * * * *

UNITED STATES PATENT AND TRADEMARK OFFICE
CERTIFICATE OF CORRECTION

PATENT NO. : 4,386,242
DATED : May 31, 1983
INVENTOR(S) : Harold Seidel

It is certified that error appears in the above-identified patent and that said Letters Patent is hereby corrected as shown below:

Column 3, line 29, "inserting" should read --inverting--.
Column 4, line 44, "$Z_R^2$" should read --$Z_R^2$--; line 58, "$Z_R^2$" should read --$Z_R^2$--. Column 5, line 47, "$\frac{1}{Z_1^2}$" should read --$\frac{1}{Z_1^2}$--; line 55, that portion of the equation reading "$Z_1^2$" should read --$Z_1^2$--. Column 6, line 1, "(1-P$^2$/2P)" should read --$(\frac{1-P^2}{2P})$--. Column 7, line 36, "part" should read --port--.

Signed and Sealed this

Twenty-fifth Day of October 1983

[SEAL]

Attest:

GERALD J. MOSSINGHOFF

Attesting Officer   Commissioner of Patents and Trademarks